(12) United States Patent
Shah et al.

(10) Patent No.: US 10,697,061 B2
(45) Date of Patent: Jun. 30, 2020

(54) TWO ZONE FLOW COOLING PLATE DESIGN WITH CONCENTRIC OR SPIRAL CHANNEL FOR EFFICIENT GAS DISTRIBUTION ASSEMBLY COOLING

(71) Applicant: Applied Materials, Inc., Santa Clara, CA (US)

(72) Inventors: Kartik Shah, Saratoga, CA (US); Nisha Prakash Holla, Bangalore (IN); Vijaykumar Krithivasan, San Jose, CA (US); Anantha K. Subramani, San Jose, CA (US); Hamid Noorbakhsh, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 232 days.

(21) Appl. No.: 15/808,543

(22) Filed: Nov. 9, 2017

(65) Prior Publication Data

US 2018/0142352 A1 May 24, 2018

Related U.S. Application Data

(60) Provisional application No. 62/424,916, filed on Nov. 21, 2016.

(51) Int. Cl.
*C23C 16/40* (2006.01)
*C23C 16/455* (2006.01)
(Continued)

(52) U.S. Cl.
CPC .... *C23C 16/45565* (2013.01); *C23C 16/4411* (2013.01); *C23C 16/452* (2013.01);
(Continued)

(58) Field of Classification Search
CPC ............ C23C 16/45565; C23C 16/505; C23C 16/45572; C23C 16/45561; C23C 16/452;
(Continued)

(56) References Cited

U.S. PATENT DOCUMENTS 6,499,533 B2 12/2002 Yamada
2001/0047760 A1* 12/2001 Moslehi ................ H01J 37/321
118/723 I
(Continued)

FOREIGN PATENT DOCUMENTS

| CN | 101981669 | * | 2/2011 | .......... C23C 16/455 |
| EP | 1219141 A1 | | 7/2002 | |
| JP | 2003035494 A | * | 2/2003 | .......... F28D 15/043 |

OTHER PUBLICATIONS

Machine Translation of JP-2003035494-A. https://www.j-platpat.inpit.go.jp/p0200.*

(Continued)

*Primary Examiner* — Rudy Zervigon
(74) *Attorney, Agent, or Firm* — Patterson + Sheridan, L.L.P.

(57) ABSTRACT

An apparatus and method for cooling a gas distribution assembly with a cooling plate. The cooling plate having a body having a top surface, an outer perimeter, a center, an inner zone and an outer zone. A plurality of channels formed through the top surface. The plurality of channels having a first outer channel having one or more first outer channel segments configured for flowing a first cooling fluid from a cooling fluid inlet to a cooling fluid outlet and a first inner channel disposed between the first outer channel and the center having one or more first inner channel segments configured for flowing a second cooling fluid from a cooling fluid inlet to a cooling fluid outlet wherein flow in adjacent segments is in an opposite direction.

5 Claims, 10 Drawing Sheets

(51) Int. Cl.
*C23C 16/505* (2006.01)
*C23C 16/44* (2006.01)
*C23C 16/452* (2006.01)
*H01J 37/32* (2006.01)

(52) U.S. Cl.
CPC .. *C23C 16/45561* (2013.01); *C23C 16/45572* (2013.01); *C23C 16/505* (2013.01); *H01J 37/3244* (2013.01); *H01J 37/32522* (2013.01)

(58) Field of Classification Search
CPC ............ C23C 16/4411; H01J 37/32522; H01J 37/3244
USPC .......... 118/724; 156/345.33, 345.34, 345.37, 156/345.53
See application file for complete search history.

(56) References Cited

U.S. PATENT DOCUMENTS

| | | |
|---|---|---|
| 2007/0128862 A1 | 6/2007 | Ma et al. |
| 2007/0137573 A1* | 6/2007 | Kholodenko ..... H01J 37/32091 118/723 E |
| 2007/0139856 A1 | 6/2007 | Holland et al. |

OTHER PUBLICATIONS

Machine Translation for CN101981669.*
International Search Report and Written Opinion for PCT/US2017/060935 dated Feb. 20, 2018.

* cited by examiner

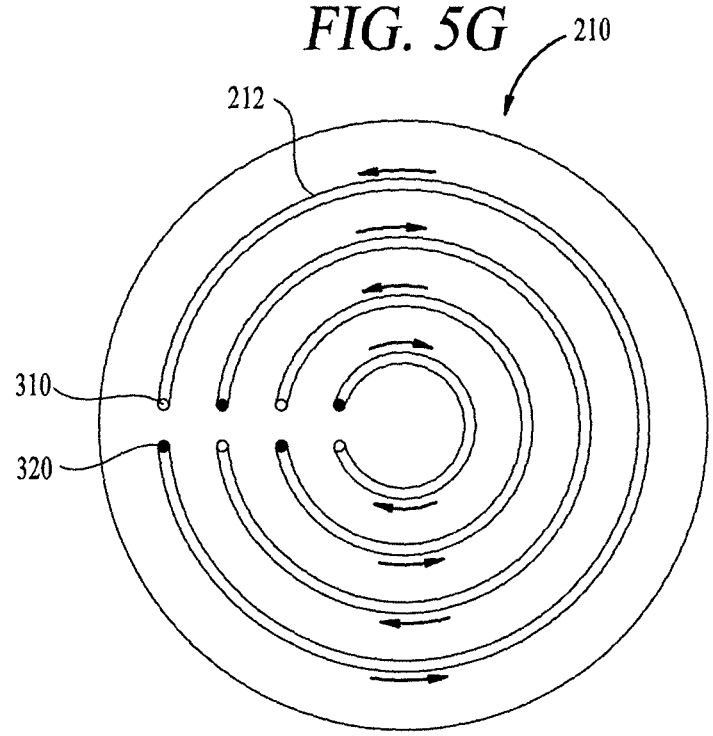
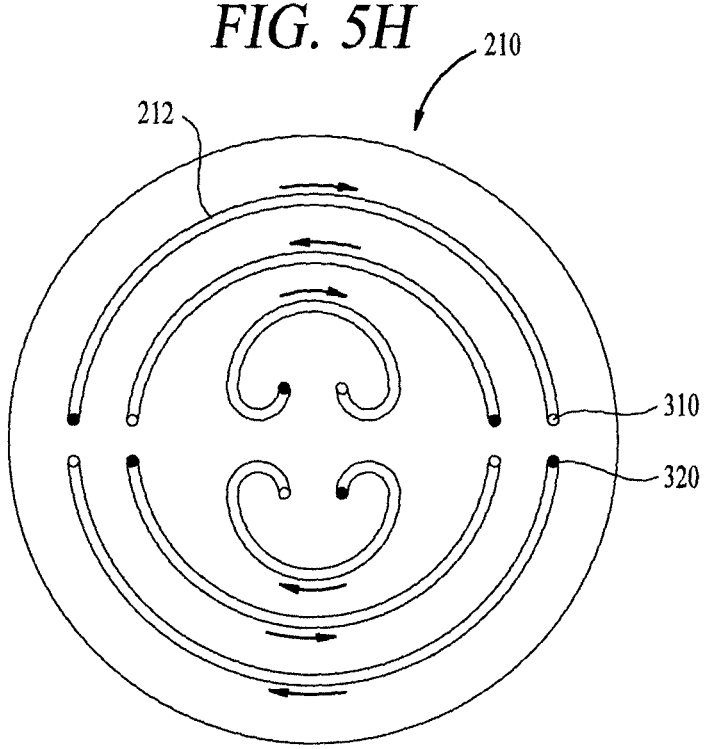

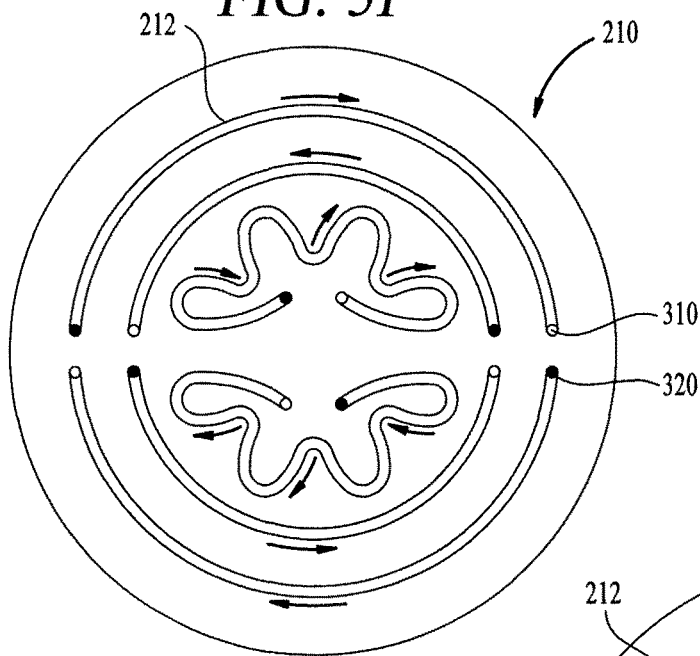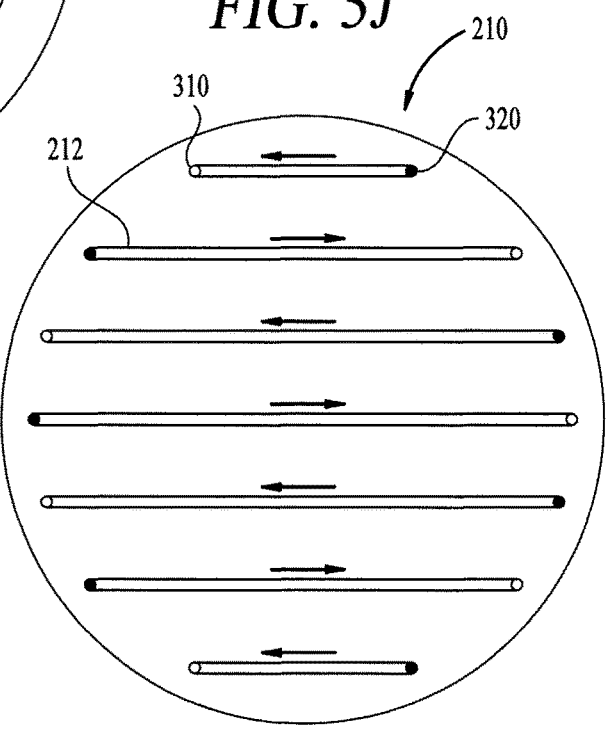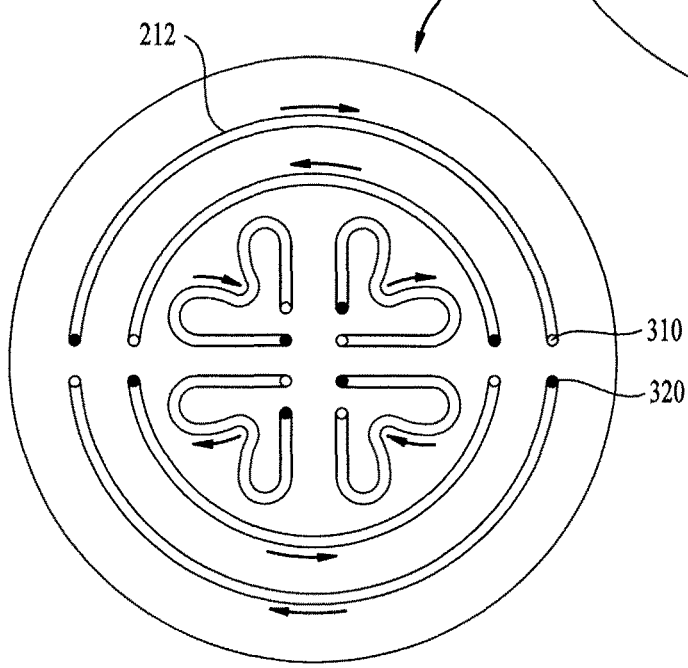

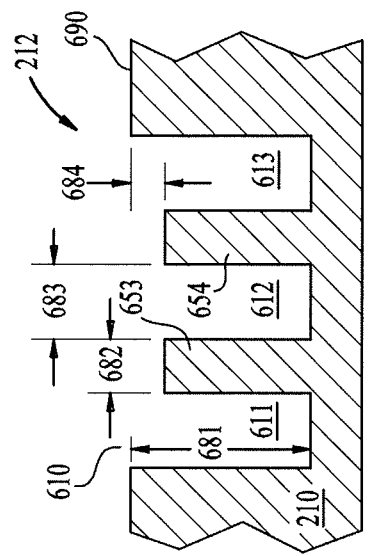
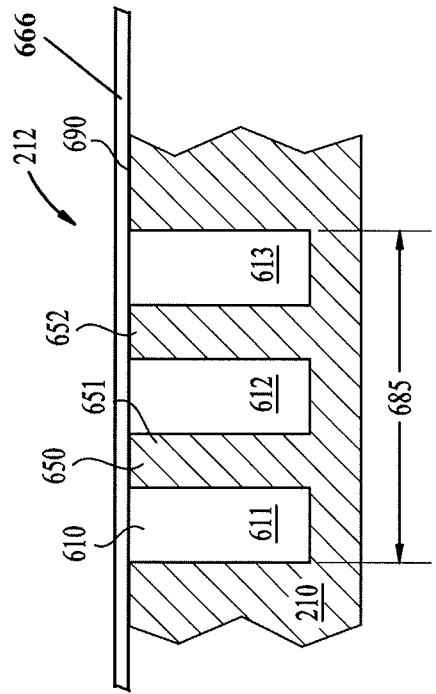
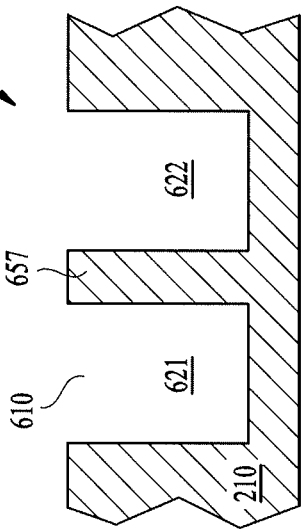
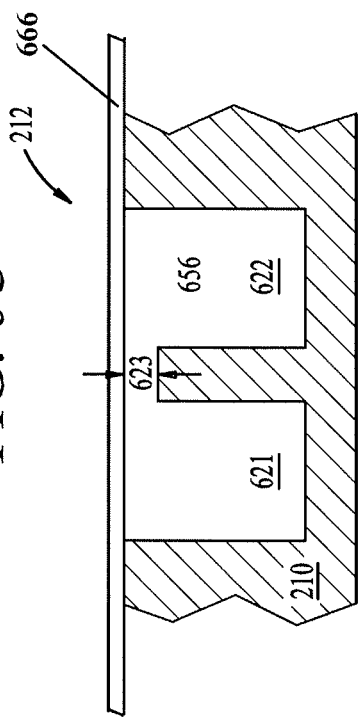

TWO ZONE FLOW COOLING PLATE DESIGN WITH CONCENTRIC OR SPIRAL CHANNEL FOR EFFICIENT GAS DISTRIBUTION ASSEMBLY COOLING

CROSS-REFERENCE TO RELATED APPLICATIONS

This application claims benefit of U.S. Provisional Application Ser. No. 62/424,916, filed Nov. 11, 1016, of which is incorporated by reference in its entirety.

BACKGROUND

Field

The present disclosure generally relates to a chill pate of a showerhead assembly for a processing chamber.

Description of the Related Art

In the semiconductor industry, devices are fabricated by a number of manufacturing processes, such as etching and deposition, producing structures on an ever-decreasing size. As device geometries shrink, susceptibility to defects increases as process controls vary across the chamber components and additionally the substrate. The production of ever smaller devices without defects relies on good uniformity of the plasma utilized in the plasma processing chamber in which the substrate is processed Accordingly, as device geometries shrink, uniformity of process parameters across a substrate becomes critical for the manufacture of the devices on the substrate.

Showerhead assemblies introduce process gases into the processing chamber and maintain the plasma from the gases for processing the substrate. Current showerhead assemblies often cannot meet temperature uniformity specifications particularly at lower power loads. The non-uniform temperature of the conventional showerhead assemblies results in a radial profile variation for deposited substrate films.

There is a need for an improved showerhead to promote plasma processing uniformity.

SUMMARY

An apparatus and method for cooling a gas distribution assembly with a cooling plate. The cooling plate having a body having a top surface, an outer perimeter, a center, an inner zone and an outer zone. A plurality of channels formed through the top surface. The plurality of channels having a first outer channel having one or more first outer channel segments configured for flowing a first cooling fluid from a cooling fluid inlet to a cooling fluid outlet and a first inner channel disposed between the first outer channel and the center having one or more first inner channel segments configured for flowing a second cooling fluid from a cooling fluid inlet to a cooling fluid outlet wherein flow in adjacent segments is in an opposite direction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIGS. 5A through 5K illustrate alternate examples of cooling channels formed in the cooling plate.

FIGS. 6A through 6D illustrate example cross sections of a single channel in the cooling plate having two or more grooves.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally relate to a cooling plate in a showerhead to enhance plasma processing performance with differentiated heat load requirements. Cooling channels formed in the cooling plate incorporate radial segmentation for flow tune-ability, counter-flow action for optimum heat transfer and spheroidality for maximizing heat transfer area. Advantageously, temperature uniformity across the gas distribution plate of the shower head was improved to about plus/minus 3° Celsius, or about 85%, better than conventional showerheads. Additionally, the overall thickness of the cooling plate was reduced over conventional cooling plates, while provided better the thermal performance. The improved cooling plate capabilities enhance performance on plasma processing etch platforms having differentiated heat load requirements. It should be understood that the embodiments for the cooling plate disclosed herein may be utilized independently or may be utilized together to achieve improved heat distribution and uniformity in the showerhead for improved processing uniformity of a substrate.

Figure 1:
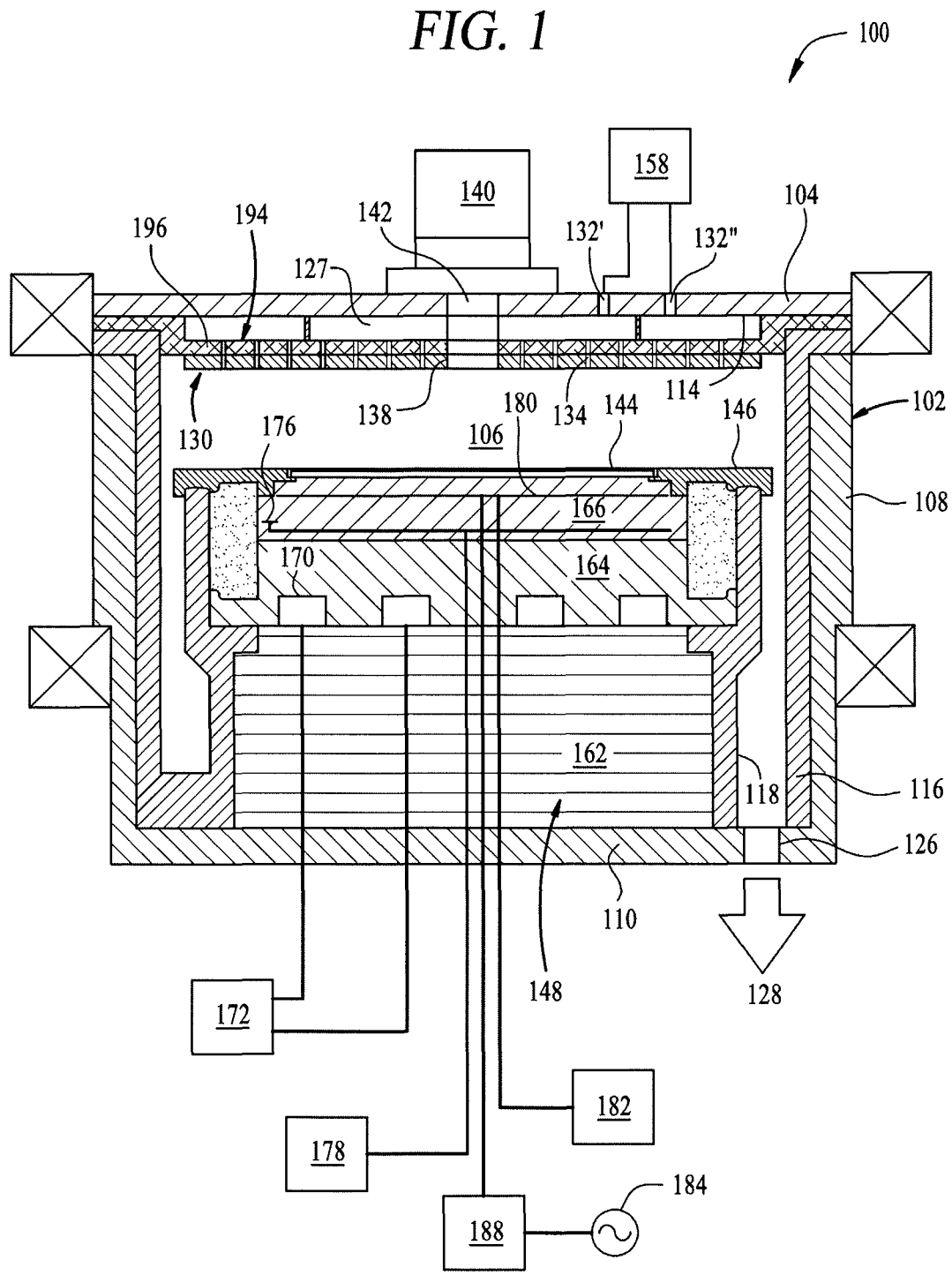
FIG. 1 is a sectional view of one embodiment of a semiconductor processing chamber having a gas distribution assembly.

FIG. 1 is a sectional view of one embodiment of a semiconductor processing chamber 100 having a gas distribution assembly 130. The processing chamber 100 includes a chamber body 102 and a lid 104 which enclose an interior volume 106.

The chamber body 102 is typically fabricated from aluminum, stainless steel or other suitable material. The chamber body 102 generally includes sidewalls 108 and a bottom 110. A substrate access port (not shown) is generally defined in the sidewall 108 and is selectively sealed by a slit valve to facilitate entry and egress of a substrate 144 from the processing chamber 100.

An outer liner 116 may be positioned against or on the sidewalls 108 of the chamber body 102. The outer liner 116 may be fabricated from aluminum oxide and/or coated with a plasma or halogen-containing gas resistant material such as yttria, yttria alloy or an oxide thereof such as $Y_2O_3$.

An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106.

The lid 104 is sealingly supported on the sidewall 108 of the chamber body 102. The lid 104 may be opened to allow excess to the interior volume 106 of the processing chamber 100. The lid 104 may optionally include a window 142 that facilitates optical process monitoring. In one embodiment, the window 142 is comprised of quartz or other suitable material which permits the transmission of a signal utilized by an optical monitoring system 140.

A gas panel 158 is coupled to the processing chamber 100 to provide process and/or cleaning gases to the interior volume 106. Examples of processing gases may include halogen-containing gas, such as $C_2F_6$, $SF_6$, $SiCl_4$, HBr, $NF_3$, $CF_4$, $Cl_2$, $CHF_3$, $CF_4$, and $SiF_4$, among others, and other gases such as $O_2$, or $N_2O$. Examples of carrier gases include $N_2$, He, Ar, other gases inert to the process and non-reactive gases. Inlet ports 132', and optionally 132", are provided in the lid 104 to allow gases to be delivered from the gas panel 158 to the interior volume 106 of the processing chamber 100 through the gas distribution assembly 130.

A substrate support assembly 148 is disposed in the interior volume 106 of the processing chamber 100 below the gas distribution assembly 130. The substrate support assembly 148 holds the substrate 144 during processing. An edge deposition ring 146 is sized to receive the substrate 144 thereon while protecting the substrate support assembly 148 from plasma and deposited material. An inner liner 118 may be coated on the periphery of the substrate support assembly 148. The inner liner 118 may be a halogen-containing gas resistant material which is substantially similar to material used for the outer liner 116. In one embodiment, the inner liner 118 may be fabricated from the same material as that of the outer liner 116.

In one embodiment, the substrate support assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among other, to the base 164 and the electrostatic chuck 166.

At least one of the base 164 or the electrostatic chuck 166 may include at least one optional embedded heater 176 and a plurality of conduits 170 to control the lateral temperature profile of the substrate support assembly 148. The conduits 170 are fluidly coupled to a fluid source 172 that circulates a temperature regulating fluid therethrough. The heater 176 is regulated by a power source 178. The conduits 170 and heater 176 are utilized to control the temperature of the base 164, thereby heating and/or cooling the electrostatic chuck 166.

The electrostatic chuck 166 comprises at least one clamping electrode 180 controlled using a chucking power source 182. The electrode 180 may further be coupled to one or more RF power sources 184 through a matching circuit 188 for maintaining a plasma formed form process and/or other gases within the processing chamber 100. The RF power sources 184 are generally capable of producing an RF signal having a frequency from about 50 kHz to about 3 GHz and a power of up to about 10,000 Watts.

The gas distribution assembly 130 is coupled to an interior surface 114 of the lid 104. The gas distribution assembly 130 has a gas distribution plate 194. The gas distribution assembly 130 has a plenum 127 defined between the lid 104 and the gas distribution plate 194. The gas distribution plate 194 may be coupled to or have a conductive base plate 196. The conductive base plate 196 may serve as an RF electrode. The gas distribution plate 194 may be a flat disc having a plurality of apertures 134 formed in the lower surface of the gas distribution plate 194 facing toward the substrate 144. The apertures 134 allow the gases to flow from the inlet port 132 (shown as 132', 132") through the plenum 127 and out the apertures 134 into the interior volume 106 of the processing chamber 100 in a predefined distribution across the surface of the substrate 144 being processed in the processing chamber 100. The gases entering the interior volume 106 may be energized by the RF electrode for maintaining a plasma in the interior volume 106 of the processing chamber 100.

Figure 2:
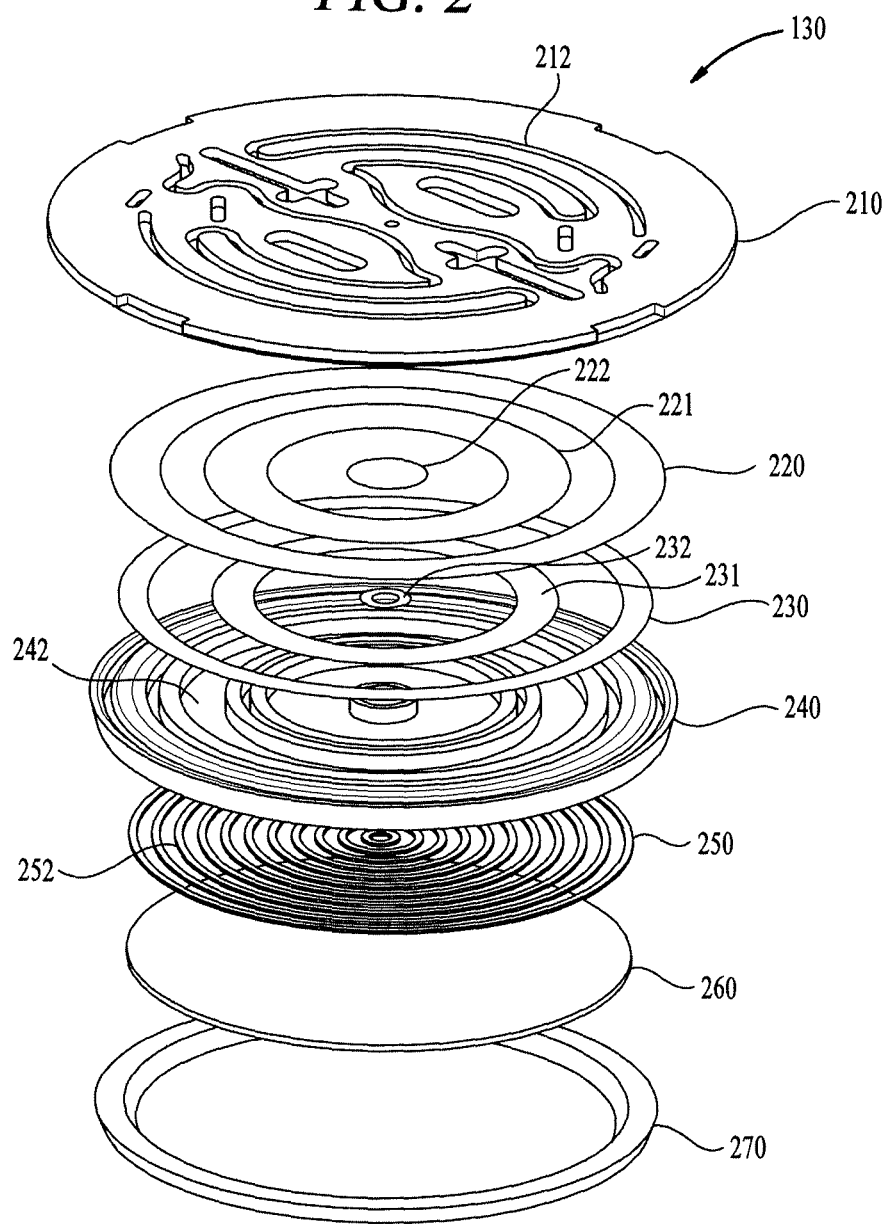
FIG. 2 is a perspective exploded schematic view of the gas distribution assembly of FIG. 1 according to one embodiment.

FIG. 2 is a perspective exploded schematic view of the gas distribution assembly 130 of FIG. 1 according to one embodiment. The gas distribution assembly 130 has a clamp ring 270, a gas distribution plate 260 (item 194 in FIG. 1), and a showerhead 240. The gas distribution assembly also has a cooling plate 210 for maintaining a temperature of the gas distribution assembly 130.

The clamp ring 270 may be disposed about the gas distribution plate (GDP) 260 and hold the GDP 260 affixed to the gas distribution assembly 130. The GDP 260 may a plurality of gas passageways (not shown). Gas entering the gas distribution assembly 130 from the gas panel 158 is provided through the gas passageways into the interior volume 106 where the gas may be energized to form plasma. The GDP 260 may be formed from silicon (Si) or other material suitable for exposure to a plasma environment. In one embodiment, a seal may be disposed between the clamp ring 270 and the GDP 260 for making a fluid tight seal.

The GDP 260 may be a flat disc having a plurality of apertures 134 (not shown in FIG. 2) formed in the lower surface of the gas distribution assembly 130 facing toward the substrate 144. Apertures 134 allow the gases to flow from the gas panel 158 out the apertures 134 into the interior volume 106 of the processing chamber 100 in a predefined distribution across the surface of the substrate 144 being processed in the processing chamber 100. The GDP 260 may be fabricated from a ceramic material, such as silicon carbide, bulk yttrium or oxide thereof to provide resistance to halogen-containing chemistries. In one embodiment, the GDP 260 is formed from silicon (Si).

A thermal gasket 250 may be disposed between the GDP 260 and the showerhead 240. The thermal gasket 250 may be a thin walled gasket having a thickness of about 1 mm or less. The thermal gasket 250 may have a thermal coefficient K of about 10 W/m-K. The thermal gasket 250 may form a gas tight seal between the GDP 260 and the showerhead 240. The thermal gasket 250 may be formed in one or more concentric rings 252. The concentric rings 252 of the thermal gasket 250 may be arranged such that the fluid passages between the showerhead 240 and the GDP 260 are not blocked while maintaining the gas tight seal therebetween, i.e., gas does not escape from between the GDP 260 and the showerhead 240.

The showerhead 240 may have a plurality of plenums 242. The plenums 242 may be concentrically arranged about the center of the showerhead 240. In one embodiment, each of the plurality of plenums 242 is fluidly isolated from adjacent or other plenums 242 in the showerhead 240. (i.e., gas does not flow between plenums) Thus, each plenum may be independently controlled such that the gas pressure in one plenum is independent or even different, then the gas pressure in another plenum 242. In a second embodiment, two or more plenums 242 may be fluidly coupled together and gas entering the plenums 242 may be shared therebetween. For example, a first and second plenum may be fluidly coupled such that a pressure in the first plenum is substantially similar to a pressure in the second plenum.

The showerhead 240 may additionally have one or more heaters disposed therein. The heaters (not shown in FIG. 2) may be formed as a ring (shown in FIGS. 6A-6D). The rings may be disposed in the plenums 242 or proximate thereto. The heaters may heat the temperature of the showerhead 240 or the gas in the plenums 242 when there is no plasma power.

One or more shims 220 may be disposed between the cooling plate 210 and the showerhead 240. For example, a first shim 220 and a second shim 230 may be staked to obtain a thermal barrier and thickness. Each set of shims, for example shims 220, may have one or more rings 221, 222. The rings 221, 222 of the first shim 220 may or may not be congruent with the rings 231, 231 of the shims 230 adjacent and stacked therebetween the cooling plate 210 and the showerhead 240. The first shims 220 and second shims 230 may together, or in combination, have a thermal conductivity (k) of about 10 W/m-K and a thickness t of about 0.25 mm.

The cooling plate 210 has a body and a plurality of channels 212 formed therein. The cooling plate 210 may be fabricated by aluminum, stainless steel or other suitable materials. The cooling plate 210 may have a thickness between about 1.5 inches and about 0.5 inches. The layout of the channels 212 reduced the thickness of the cooling plate 210 over conventional designs while provided better thermal performance. The gas distribution assembly 130 also has a cover plate (shown as item 666 in FIG. 6) disposed above the cooling plate 210. The cover plate 666 seals the channels 212 in the cooling plate 210 to keep the cooling fluid in the channels 212.

A cooling fluid may flow through the channels 212 to maintain the temperature of the gas distribution assembly 130. The channels 212 may be radially segmentation with multiple zones allowing for zonal flowrate tune-ability, i.e., the ability to control the cooling fluid in individual radial zones. Adjacent channels 212 are configured to flow cooling fluid in opposite directions to improve heat transfer and temperature uniformity. For example, cooling fluid entering one channel 212 will be cooler than when the cooling fluid exits the channel 212 due to the thermal uptake of the cooling fluid. The counter flow of the cooling fluid in adjacent channels compensates the added temperature in one channel with the cooler temperature within an adjacent channel 212 to aid in temperature uniformity across the cooling plate 210. Additionally, the channels 212 are arranged spheroidality, i.e., in concentric or spiral channels, to maximize the surface area for heat transfer. The channels 212 are further optimized in the cross-section with added fins and high aspect ratios (height (depth) to width) which is discussed further below with respect to FIGS. 6A-6D.

Figure 3:
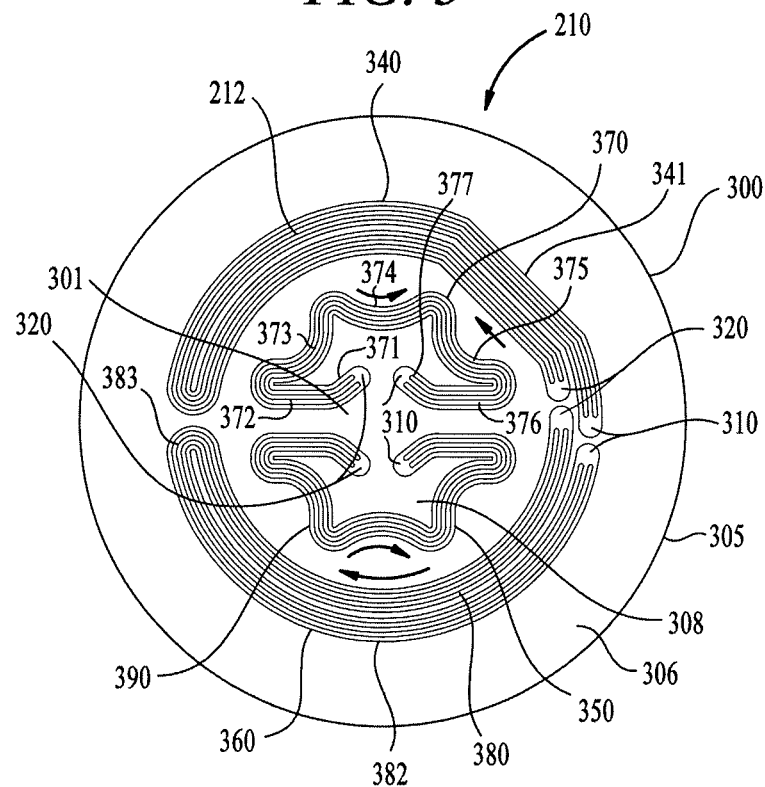
FIG. 3 is a top view for a cooling plate that may be used in the gas distribution assembly according to one embodiment

FIG. 3 is a top view for a cooling plate 300 that may be used in the gas distribution assembly 130 according to one embodiment. The first cooling plate 300 has a first outer channel 340, a second outer channel 360, a first inner channel 370 and a second inner channel 390. The first outer channel 340 may be substantially a mirror of the second outer channel 360 with deviations to accommodate utilities and other connections in the first cooling plate 300. Similarly, the first inner channel 370 may be a mirror of the second inner channel 390. The combination of the first outer channel 340 and the second outer channel 360 circumscribe both the first inner channel 370 and the second inner channel 390. Each of the first outer channel 340 and the second outer channel 360 are separately controlled an outer-zone 306. Additionally, the first inner channel 370 and the second inner channel 390 flows are separately controlled in an inner-zone 308 for enhance lateral temperature control of the gas distribution assembly 130.

Each channel 212 has a respective cooling fluid inlet 320 into which a cooling fluid enters the channel 212. Additionally, each channel 212 has a respective cooling fluid outlet 310 from which a cooling fluid leaves the channel 212 and the first cooling plate 300. In one embodiment, the respective cooling fluid inlets 320 for the first outer channel 340 and the second outer channel 360 are located adjacent each other and the respective cooling fluid outlets 310. In a second embodiment, the cooling fluid inlet 320 and cooling fluid outlet 310 for the first outer channel 340 is located distally from the cooling fluid inlet 320 and cooling fluid outlet 310 for the second outer channel 360, i.e., on the far side across from the first inner channel 370 and the second inner channel 390 in the cooling plate 300.

The cooling fluid flows in a direction as denoted by the arrows from the cooling fluid inlet 320 to the cooling fluid outlet 310 along the path of the respective channel 212. The coolant flow in each channel 212 of the first cooling plate 300 flows in a direction opposite that the flow in an adjacent channel 212. For example, the cooling fluid flow in a first leg 380 of the second outer channel 360 is in a direction opposite to the fluid flow in an adjacent first leg 350 of the second inner channel 390 and a second leg 382 of the second outer channel 360.

In one example, the cooling fluid may enter in the cooling fluid inlet 320 for the second outer channel 360 along the first leg 380 following a perimeter 305 of the cooling plate 300 to a return bend 383 extending outward toward the perimeter 305 and following therealong the second leg 382 to the cooling fluid outlet 310. Thus, the second outer channel 360 extends along two adjacent arcs with the fluid flow starting at the cooling fluid inlet 320 immediately adjacent to where it stops at the cooling fluid outlet 310. The first outer channel 340 may mirror the shape and flow path of the second outer channel 360. Alternately, first outer channel 340 and the second outer channel 360 may be mirrored in shape but not flow, i.e., the cooling fluid inlet 320 are distally located across the inner channels 390, 370. The first outer channel 340 may additionally or optionally have a flat 341 therein to facility plumbing.

The first inner channel 370 and the second inner channel 390 may be mirrored in shape and flow. Alternately, first inner channel 370 and the second inner channel 390 may be mirrored in shape but not flow, i.e., the first inner channel 370 is flipped in flow direction such that the cooling fluid inlet 320 and cooling fluid outlet 310 are flipped. The first inner channel 370 can be described as having a first segment 371 extending outward to a second segment 372 to a series of arcs, a first arc 373, and a second arc 374, and a third arc 375. The arcs having 3 separate radiuses defining each of the first arc 373, the second arc 374, and the third arc 375. The radiuses being non-congruent and having origins disposed on a side of the arc opposite the center 301 of the first cooling plate 300. The first arc 373, the second arc 374, and the third arc 375 in totality defining a 180 degrees from the beginning of the first arc 373 to the end of the third arc 375 relative to the center 301. The first inner channel 370 continuing from the third arc 375 along a third segment 376, substantially collinear with the second segment 372, and extending through a fourth segment 377 to the cooling fluid outlet 310.

The first cooling plate 300 is easily retrofitted onto existing hardware. The effect of plasma heat load variation from center-high to uniform to edge-high, is now controllable by individually tuning the relative flow of cooling fluid between the first outer channel 340, the second outer channel 360, the first inner channel 370 and the second inner channel 390 separately in the inner-zone 308 and outer-zone 306.

Figure 4:
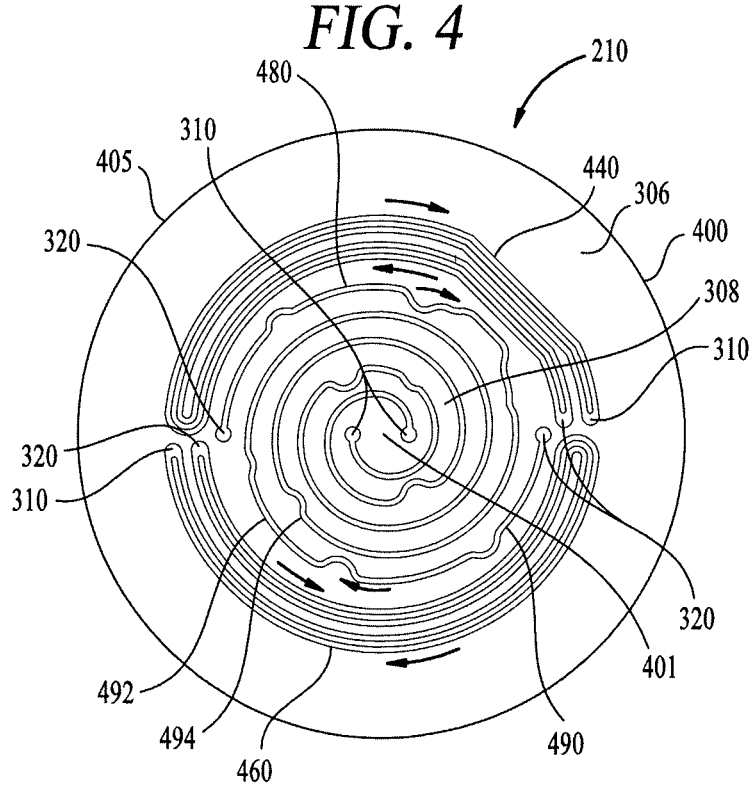
FIG. 4 is a top view for a cooling plate that may be used in the gas distribution assembly according to a second embodiment.

FIG. 4 is a top view for a cooling plate 400 that may be used in the gas distribution assembly 130 according to a second embodiment. The second cooling plate 400 has a first outer channel 440, a second outer channel 460, a first inner channel 480 and a second inner channel 490. The first outer channel 440, second outer channel 460, first inner channel 480 and second inner channel 490 have cooling fluid inlets 320 and cooling fluid outlets 310 for providing cooling fluid flow therein similar to cooling plate 300. The combination of the first outer channel 440 and the second outer channel 460 circumscribe both the first inner channel 480 and the second inner channel 490.

The first outer channel 440 of the second cooling plate 400 may be substantially similar to the first outer channel 340 of the first cooling plate 300. The second outer channel 460 of the second cooling plate 400 may be substantially similar in shape but flipped from the second outer channel 360 of the first cooling plate 300. That is, cooling fluid inlet 320 and cooling fluid outlet 310 of the second outer channel 460 is located distally from the cooling fluid inlet 320 and cooling fluid outlet 310 of the first outer channel 440.

The cooling fluid inlet 320 for the first inner channel 480 may be proximate an outer perimeter 405 of the cooling plate 400. The cooling fluid inlet 320 for the first inner channel 480 may additionally be proximate the cooling fluid inlet 320 for the second outer channel 460. The cooling fluid outlet 310 for the first inner channel 480 may be proximate a center 401 of the cooling late 400. The first inner channel 480 may be shaped as a spiral having a diminishing radius. The radius of the spiral may diminish in a clockwise or counterclockwise direction. In one embodiment, the first inner channel 480 spirals inward in a clockwise direction.

The cooling fluid inlet 320 for the second inner channel 490 may be proximate an outer perimeter 405 of the cooling plate 400. The cooling fluid inlet 320 for the second inner channel 490 may additionally be proximate the cooling fluid inlet 320 for the first outer channel 440. The cooling fluid outlet 310 for the second inner channel 490 may be proximate the center 401 of the cooling plate 400 and opposing the cooling fluid outlet 310 for the first inner channel 480 across the center 401. The second inner channel 490 may be shaped as a spiral having a diminishing radius. The radius of the spiral may diminish in a clockwise or counterclockwise direction. In one embodiment, the second inner channel 490 spirals inward in a clockwise direction.

The first inner channel 480 and the second inner channel 490 spiral about each other concentrically and form a double spiral. The concentric spirals for the inner channels 480, 490 provide a greater coverage area in the inner zone 494.

The approach for decreasing temperature variation and lowering the temperature in the gas distribution assembly 130 discussed above with respect to the cooling plate 210, 300 and 400 may be further extended to other embodiments. Further embodiments of the cooling plate include radial segmentation, dual-zone channel design for zonal flowrate tune-ability, counter-flow to deal with temperature asymmetry, concentric or spiral channels to maximize surface area for heat transfer, and optimized channel cross-sections to be discussed below with respect to FIG. 6A-6D. Adopting a more efficient cooling channel design enables better control over temperatures in the gas distribution assembly 130 as the heat load on the increases. Additionally, a controlling effect of plasma heat load variation from center-high to uniform to edge-high, is now obtainable by tuning channel flows separately in the inner-zone 308 and outer-zone 306. Further, this design concept can be applied to other chambers where zonal flow control and tuning is important for radial temperature uniformity.

FIGS. 5A through 5K illustrate examples for alternative channel designs for the cooling plate 210 described above, for example cooling plate 400. The channels 212 have a cooling fluid outlet 310 represented throughout FIG. 5A to 5K as an open circle. The channels 212 also have cooling fluid inlet 320 represented throughout FIG. 5A to 5K as a solid circle. The flow direction throughout the figures between the cooling fluid inlet 320 and cooling fluid outlet 310 are further illustrated by arrows. Additionally, the cooling plate 210 has an outer perimeter 515, inner zone 510 and an outer zone 520.

Figure 5A:
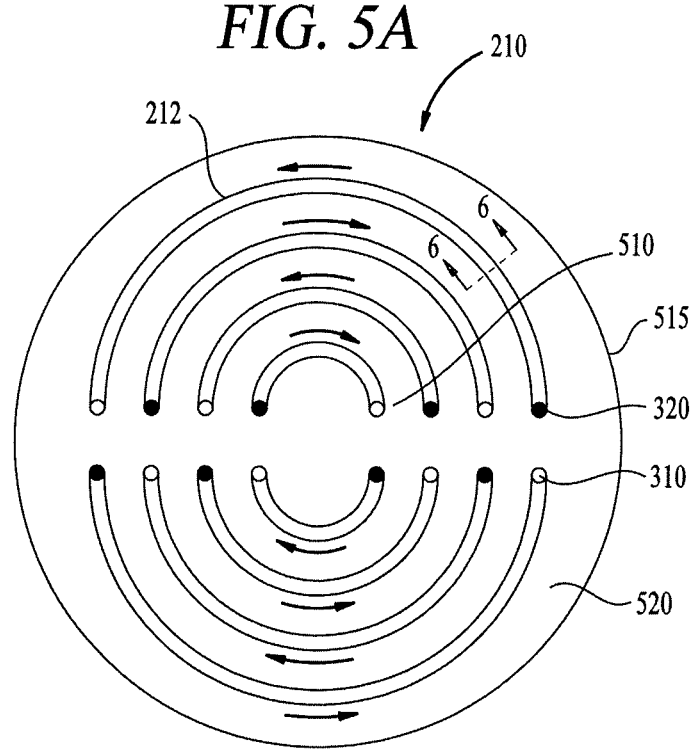

FIG. 5A illustrates an embodiment wherein the channels 212 are arranged in concentric arcs on a first portion and separately on a second portion of the cooling plate 210. The cooling plate 210 has eight (8) independent channels 212 with each channel flowing in a direction opposite that of an adjacent channel. The independently controlled channels 212 control the thermal gradient across the cooling plate 210 to produce a more uniform temperature across the gas distribution assembly 130.

Figure 5B:
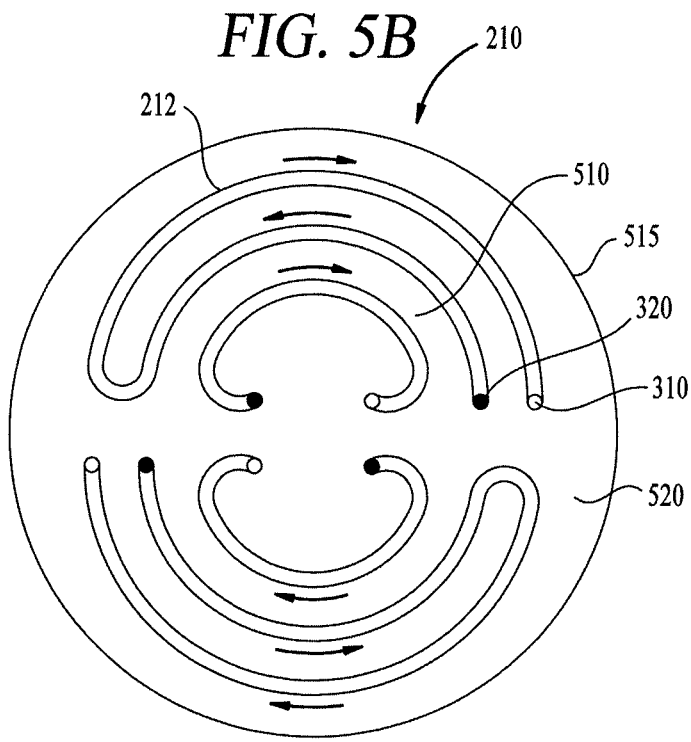

FIG. 5B illustrates another embodiment wherein the channels 212 are arranged concentrically. The cooling plate 210 has four (4) independent channels 212 with each channel flowing in a direction opposite that of an adjacent channel. The cooling channels 212 have less cooling fluid inlets 320 and cooling fluid outlets 310 to minimize the plumbing and control requirements for implementing the embodiment.

Figure 5C:
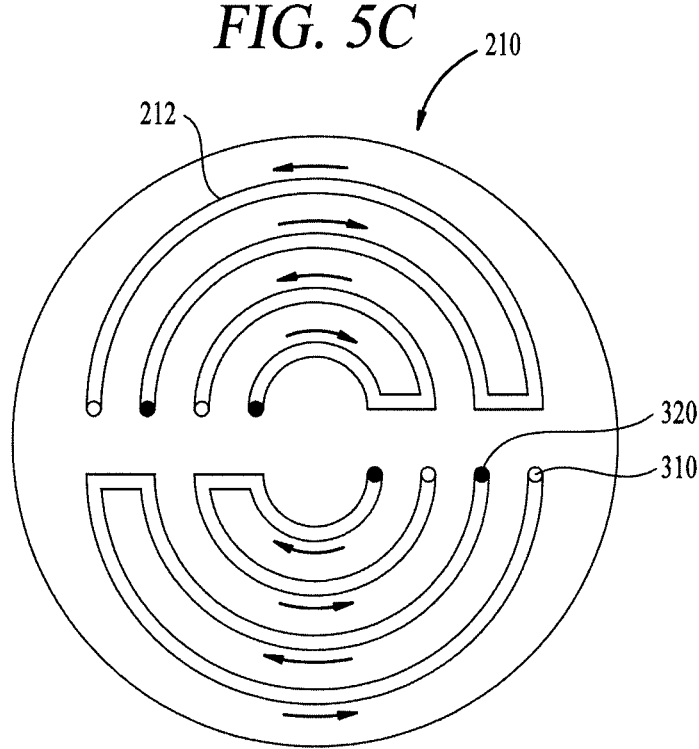

FIG. 5C illustrates another embodiment wherein the channels 212 are arranged concentrically. The cooling plate 210 has four (4) independent channels 212 with each section of the channel 212 flowing in a direction opposite that of an adjacent channel section. The cooling plate benefits with longer channels 212 in the inner portion of the cooling plate 210 for better control of the temperature uniformity across the gas distribution assembly 130.

Figure 5D:
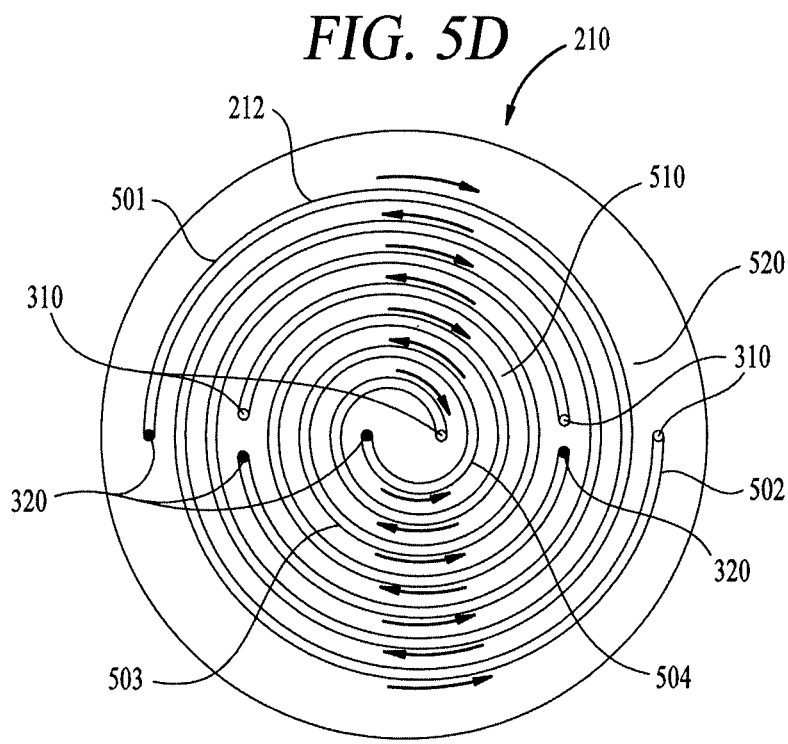

FIG. 5D illustrates another embodiment wherein the channels 212 are arranged concentrically. The cooling plate 210 has four (2) independent channels 212 with each channel flowing in a direction opposite that of an adjacent channel. Each channel 212 spirals inward with another channel to form a double spiral. The embodiment has two outer channels 212 in the outer zone 520 with a first channel 501 having a fluid flowing inward and a second channel 502 having a fluid flowing outward. The two channels 212 in the inner zone 510 similarly flow in opposite directions with a third channel 503 flowing inwards and a fourth channel 504 flowing outwards. The concentric spiral channels 212 maximize the surface area for heat transfer by having the flow direction in each channel flowing in a direction opposite an adjacent channel 212.

Figure 5E:
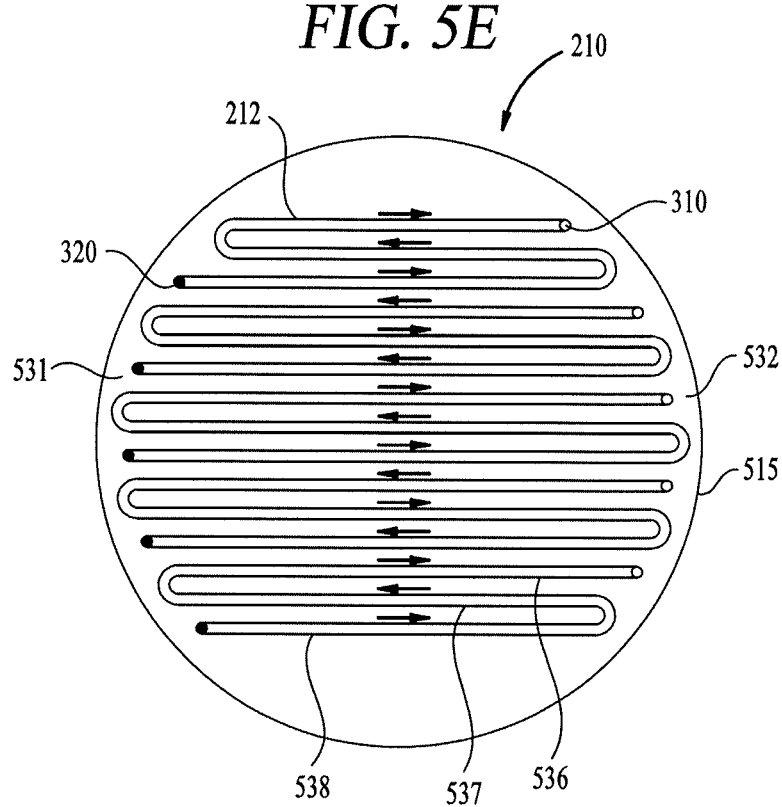

FIG. 5E illustrates another embodiment wherein the channels 212 are linearly arranged. The cooling plate 210 has five (5) independent channels 212 with each section of the channel 212 flowing in a direction opposite that of an adjacent channel section. Each channel 212 may have a first section 538, a second section 537 having flow in an opposite direction than the first section 538, and a third section 536 having a flow direction substantially similar to the first section 538. The cooling fluid inlets 320 and cooling fluid outlets 310 are arranged along the outer perimeter 515 of the cooling plate 210. The cooling fluid inlets 320 are disposed on a first half 531 of the cooling plate 210 and the cooling fluid outlets 310 are disposed on a second half 532 of the cooling plate 210. The cooling plate benefits with longer channels 212 in the inner portion of the cooling plate 210 for better control of the temperature uniformity across the gas distribution assembly 130.

Figure 5F:
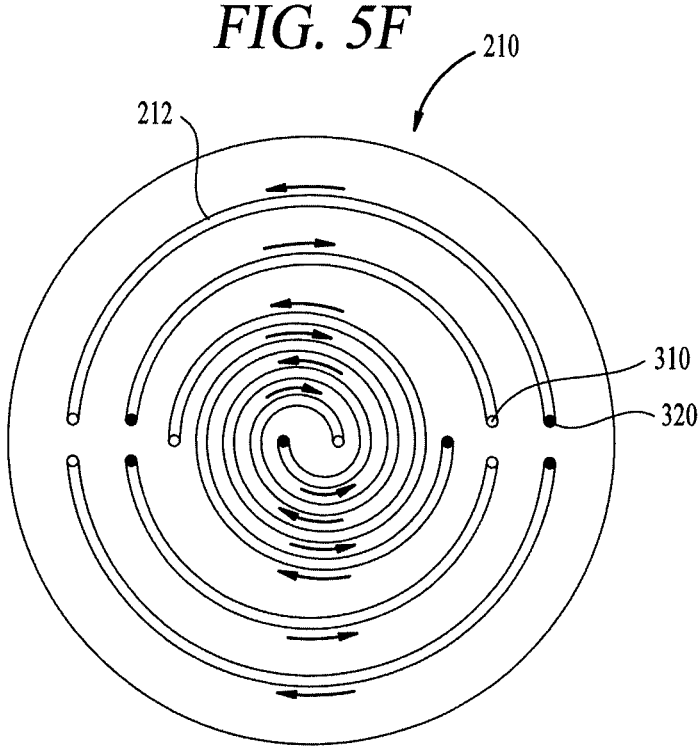

FIG. 5F illustrates another embodiment wherein the channels 212 are arranged concentrically. The channels 212 are arranged in concentric arcs on the outer zone 520 and as double spirals on the inner zone 510 of the cooling plate 210. The channels 212 have cooling fluid outlet 310 and cooling fluid inlet 320. The cooling plate 210 has six (6) independent channels 212 with four (4) channels in the outer zone 520 and two (2) channels 212 in the inner zone 510. Each channel 212 flows in a direction opposite that of any adjacent channels.

FIG. 5G illustrates another embodiment wherein the channels 212 are arranged concentrically. The channels 212 are arranged in a series of four concentric arcs having lengths greater than 270 degrees. The cooling fluid outlet 310 of each channel 212 is adjacent to the cooling fluid inlet 320 for said channel. Each channel 212 flows in a direction opposite that of any adjacent channels.

FIG. 5H illustrates another embodiment wherein the channels 212 are arranged concentrically. Four (4) channels 212 in the outer zone 520 are arranged in concentric arcs. The cooling fluid inlet 320 for each channel 212 in the outer zone 520 is distally located from the cooling fluid outlet 310. The inner zone 510 has two (2) channels 212. Each channel 212 flows in a direction opposite that of any adjacent channels.

FIG. 5I illustrates another embodiment wherein the channels 212 are arranged concentrically. Four (4) channels 212 in the outer zone 520 are arranged in concentric arcs. The cooling fluid inlet 320 for each channel 212 in the outer zone 520 is distally located from the cooling fluid outlet 310. The inner zone 510 has two (2) channels 212. Each channel 212 in the inner zone 510 has four (4) lobes extending toward the perimeter and the cooling fluid inlet 320 and cooling fluid outlet 310 located proximate the center of the cooling plate 210. Each channel 212 flows in a direction opposite that of any adjacent channels.

FIG. 5J illustrates another embodiment wherein the channels 212 are linearly arranged. The cooling plate 210 has seven (7) independent channels 212 flowing in a direction opposite that of an adjacent channel. The cooling fluid inlets 320 and cooling fluid outlets 310 are arranged along the outer perimeter 515 of the cooling plate 210. The cooling plate benefits with shorter length channels 212 for better control of the temperature uniformity across the gas distribution assembly 130.

FIG. 5K illustrates another embodiment wherein the channels 212 are arranged concentrically. Four (4) channels 212 in the outer zone 520 are arranged in concentric arcs. The cooling fluid inlet 320 for each channel 212 in the outer zone 520 is distally located from the cooling fluid outlet 310. The inner zone 510 has (4) channels 212. Each channel 212 forming a heart shape with the fluid inlet 320 and fluid outlet 310 proximate the center disposed on vertices arranged in about 90 degrees orientation to each other. Each channel 212 flows in a direction opposite that of any adjacent channels.

The channels 212 discussed above with respect to the figures may have one or more grooves and or fins therein to promote fluid flow or heat transfer. FIGS. 6A through 6D illustrate example cross sections of a single channel 212 in the cooling plate 210 having two or more grooves. The cooling plate has a top surface 610 into which the grooves 610 are formed. The cover plate 666 fluidly seals the grooves 610 and prevents cooling fluid in the channel 212 from leaking from the grooves so that all the cooling fluid is routed to the cooling fluid outlet 310. FIGS. 6A-6D are typical cross-sections which may be taken anywhere along the channel 212. It is contemplated that one example of the channel 212, such as that shown in FIG. 6A, may have a groove 610 which is utilized throughout all the channels 212 in the cooling plate 210. However, one skilled in the art should appreciate that the configuration and profile of one groove 610 in one channel 212 may differ then the configuration and profile of the groove 610 in an adjacent channel 212 or even in a different location along the same channel 212 in the cooling plate 210. The groove 610 may be configured to handle the expected thermal load with consideration for available space for the grooves 610 in an area of the cooling plate 210.

FIG. 6A illustrates on example of a channel 212 having three grooves 610. The grooves 610 comprising the channel 212 may have a first groove 611, a second groove 612 and a third groove 613. The grooves 610 are separated by fins 650 such as a first fin 651 separating the first groove 611 and the second groove 612 and a second fin 652 separating the second groove 612 and the third groove 613. The second fin 652 and the first fin 651 extend substantially planar with the top surface 690 of the cooling plate 210 allowing the cover plate 666 to substantially seal against the fins 650. Thus, the fins 650 not only act to prevent flow between each of the first groove 611, second groove 612 and third groove 613, but also assist in dissipating heat from the cooling plate 210 by increasing the rate of heat transfer by increasing the convection area. In one embodiment, the cooling plate 210 may have 3 grooves 610 having a cross-section width 685 of between about 0.6" and about 0.7" such as 0.66". Each groove may have a width (683 in FIG. 6B) of about 0.100" to about 0.2" such as about 0.125" and a depth (681 in FIG. 6B) of about 0.7" to about 0.8" such as about 0.75" in.

FIG. 6B illustrates a second example of a channel 212 having three grooves 610 separated by fins 650. A first fin 653 of fins 650 separating the first groove 611 and the second groove 612 and a second fin 654 of fins 650 separating the second groove 612 and third groove 613 do not extend to the top surface 690 such that a gap 684 is disposed between the fins 650 and the cover plate 666 sealing the grooves 610. Cooling fluid may flow from the first groove 611 to the second groove 612 or third groove 613 through the gap 684 for providing more even cooling by allowing cooling fluid to flow between the grooves 610 while benefiting from the heat convention through the fins 650.

FIG. 6C illustrates a third example of a channel 212 having two grooves 610 separated by a fin 656. The grooves 610 may comprise a first groove 621 and a second groove 622 with the fin 656 separating the first groove 611 from the second groove 612. A gap 623 is disposed between fin 656 and the top surface 690 of the cooling plate 210 and prevents the cover plate 666 from sealing against the fin 656 while sealing the channel 212. Thus, the fin 656 permits flow of cooling fluid between the first groove 621 and the second groove 622 while dissipating heat from the cooling plate 210 by increasing the rate of heat transfer by increasing the convection area. In one embodiment, the cooling plate 210 may have 2 grooves 610 having a cross-section width 685 of between about 0.35" and about 0.7" such as 0.6". Each groove may have a width (683 in FIG. 6B) of about 0.100" to about 0.3" such as about 0.15" and a depth (681 in FIG. 6B) of about 0.7" to about 0.8" such as about 0.75" in.

FIG. 6D illustrates a fourth example of a channel 212 having two grooves 610 separated by a fin 657. The fin 657 extends substantially coplanar with the top surface 690 such that the cover plate 666 seals against the fin 657 to prevent fluid flow between each of the first groove 621 from the second groove 622.

Figure 7:
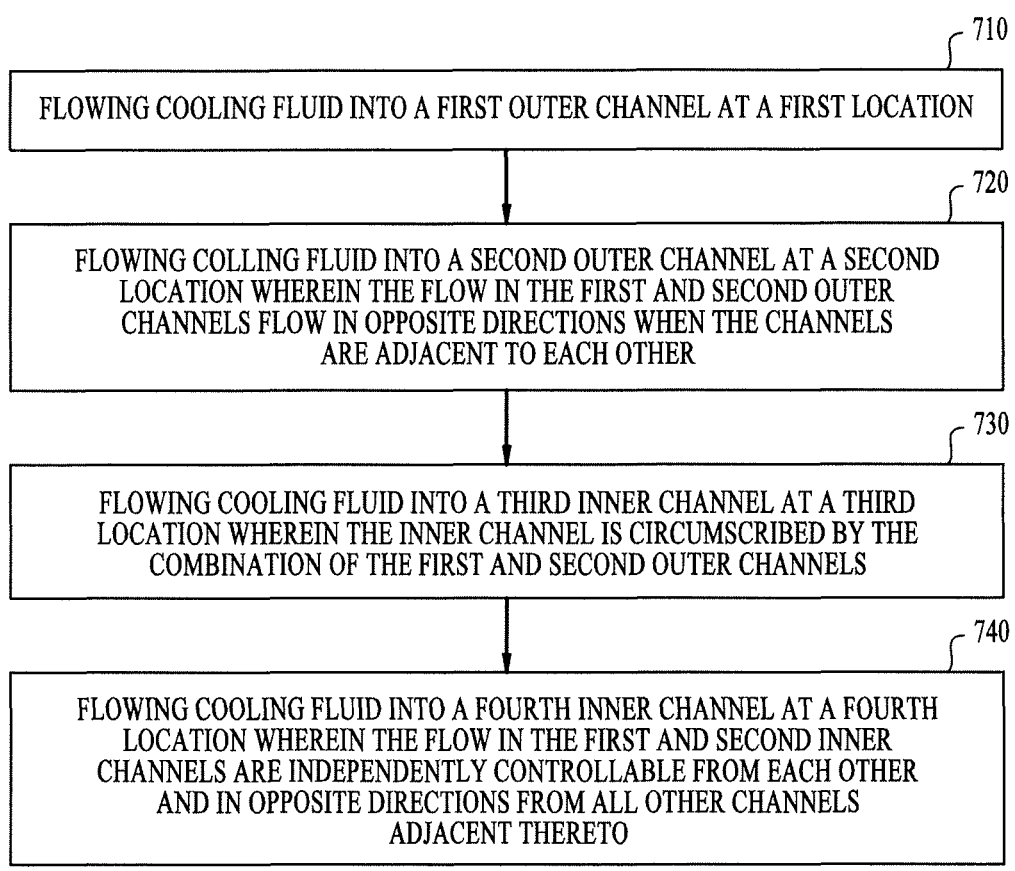
FIG. 7 illustrates a method for cooling a gas distribution assembly with the cooling plate.

FIG. 7 illustrates a method 700 for cooling the showerhead assembly with the cooling plate. The method 700 begins at block 710 where cooling fluid flows into a first outer channel at a first location. At block 720, cooling fluid flows into a second outer channel at a second location wherein the flow in the first and second outer channels are independently controllable from each other and flow in opposite directions when the channels are adjacent to each other. At block 730, cooling fluid flows into a third inner channel at a third location wherein the inner channel is circumscribed by the combination of the first and second outer channels. At block 740, cooling fluid flows into a fourth inner channel at a fourth location wherein the first inner channel and second inner channel forms a double spiral and the flow in the first and second inner channels are independently controllable from each other and in opposite directions from all other channels adjacent thereto.

Advantageously, the improvements in cooling the gas distribution assembly 130 with the cooling plates 210, 300, 400 result in lower maximum temperatures and better uniformly distributed temperatures laterally across the gas distribution assembly 130. For example, in the conventional cooling plate design, the gas distribution plate may experience temperature variations of about plus or minus about 17° Celsius. In one embodiment of the cooling plate 300, the temperature variation of the GDP 260 may be plus or minus about 12° Celsius. In another embodiment for the cooling plate 400, the temperature variation of the GDP 260 may be plus or minus about 5° Celsius.

The cooling improvements to the cooling the gas distribution assembly 130 with the cooling plates 300, 400 also extend to the cover plate 666. In the conventional cooling plate design, the temperature variation of the cover plate 666 may be plus or minus about 17° Celsius. In one embodiment for the cooling plate 300, the temperature variation of the cover plate 666 may be plus or minus about 13° Celsius. In another embodiment for the cooling plate 400, the temperature variation of the cover plate 666 may be plus or minus about 7° Celsius.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

While the foregoing is directed to embodiments of the present invention, other and further embodiments of the invention may be devised without departing from the basic scope thereof, and the scope thereof is determined by the claims that follow.

What is claimed is:

1. A cooling plate comprising:
a body having a top surface, an outer perimeter, a center, an inner zone and an outer zone; and
a plurality of channels formed through the top surface and into the body, the plurality of channels comprising:
a first outer channel having one or more first outer channel segments, a cooling fluid inlet and a cooling fluid outlet disposed proximate the outer perimeter configured for flowing a first cooling fluid from the cooling fluid inlet to the cooling fluid outlet;
a first inner channel disposed between the first outer channel and the center having one or more first inner channel segments, an inner cooling fluid inlet and an inner cooling fluid outlet configured for flowing a second cooling fluid from the inner cooling fluid inlet to the inner cooling fluid outlet wherein flow at an intersection in each adjacent segment of the one or more segments at a radius of the body is in an opposite direction;
a second outer channel having one or more second outer channel segments, a cooling fluid inlet and a cooling fluid outlet disposed proximate the outer perimeter configured for flowing a third cooling fluid from the cooling fluid inlet to the cooling fluid outlet;
a second inner channel disposed between the second outer channel and the center having one or more second inner channel segments, an inner cooling fluid inlet and an inner cooling fluid outlet configured for flowing a fourth cooling fluid from the cooling fluid inlet to the cooling fluid outlet wherein flow in adjacent segments is in an opposite direction; and
wherein the first inner channel and the second inner channel form a double spiral.

2. The cooling plate of claim 1, wherein the first outer channel and the second outer channel form a double spiral.

3. The cooling plate of claim 1, wherein inlet of the first inner channel is near the center and cooling fluid in the channel flows to the outlet toward the outer cooling channels and the second inner channel flows from the inlet proximate the outer cooling channels to the outlet near the center of the cooling plate.

4. A gas distribution assembly comprising:
a gas distribution plate;
a showerhead having a lower surface and an upper surface;
a clamp ring attaching the gas distribution plate to the lower surface of the showerhead; and
a cooling plate for maintaining a temperature of the gas distribution assembly disposed above the upper surface of the showerhead and a cover plate disposed on the cooling plate opposite the showerhead, the cooling plate comprising:
a body having a top surface, an outer perimeter, a center, an inner zone and an outer zone;
a plurality of channels formed through the top surface and into the body, the plurality of channels comprising:
a first outer channel having one or more first outer channel segments, a cooling fluid inlet and a cooling fluid outlet disposed proximate the outer perimeter configured for flowing a first cooling fluid from the cooling fluid inlet to the cooling fluid outlet;

a first inner channel disposed between the first outer channel and the center having one or more first inner channel segments, an inner cooling fluid inlet and an inner cooling fluid outlet configured for flowing a second cooling fluid from the inner cooling fluid inlet to the inner cooling fluid outlet wherein flow of the first and second cooling fluid for adjacent segments along a radius extending from a center to an edge of the cooling plate is in an opposite direction;

a second outer channel having one or more second outer channel segments, a cooling fluid inlet and a cooling fluid outlet disposed proximate the outer perimeter configured for flowing a third cooling fluid from the cooling fluid inlet to the cooling fluid outlet;

a second inner channel disposed between the second outer channel and the center having one or more second inner channel segments, an inner cooling fluid inlet and an inner cooling fluid outlet configured for flowing a fourth cooling fluid from the cooling fluid inlet to the cooling fluid outlet wherein flow in adjacent segments is in an opposite direction; and wherein the first inner channel and the second inner channel form a double spiral.

5. The gas distribution assembly of claim 4, wherein the first outer channel and the second outer channel form a double spiral.

* * * * *